US012808054B2

(12) United States Patent
Fukuda et al.

(10) Patent No.: US 12,808,054 B2
(45) Date of Patent: Nov. 24, 2026

(54) SUBSTRATE PROCESSING APPARATUS

(71) Applicant: Tokyo Electron Limited, Tokyo (JP)

(72) Inventors: Naoya Fukuda, Fuchu City (JP); Motoi Yamagata, Fuchu City (JP); Hiroshi Sone, Fuchu City (JP)

(73) Assignee: Tokyo Electron Limited, Tokyo (JP)

( * ) Notice: Subject to any disclaimer, the term of this patent is extended or adjusted under 35 U.S.C. 154(b) by 398 days.

(21) Appl. No.: 18/541,164

(22) Filed: Dec. 15, 2023

(65) Prior Publication Data

US 2024/0209509 A1 Jun. 27, 2024

(30) Foreign Application Priority Data

Dec. 23, 2022 (JP) ................................ 2022-207216

(51) Int. Cl.

| | |
|---|---|
| ***C23C 16/46*** | (2006.01) |
| ***C23C 14/50*** | (2006.01) |
| ***C23C 14/54*** | (2006.01) |
| ***C23C 16/458*** | (2006.01) |

(52) U.S. Cl.

CPC .......... *C23C 16/463* (2013.01); *C23C 14/505* (2013.01); *C23C 14/541* (2013.01); *C23C 16/4584* (2013.01)

(58) Field of Classification Search

CPC . C23C 16/463; C23C 14/541; H10P 72/0432; H10P 72/7612

See application file for complete search history.

(56) References Cited

U.S. PATENT DOCUMENTS

2009/0156019 A1* 6/2009 Satoh ...................... H10P 95/00 257/E21.349
2011/0096507 A1* 4/2011 Deram ................ H10W 40/257 228/141.1
2015/0227050 A1* 8/2015 Lin ........................... G03F 7/40 438/5
2019/0273005 A1* 9/2019 Tsuji .................. H10P 72/0432

FOREIGN PATENT DOCUMENTS

JP 6559347 B2 8/2019
JP 2020072249 A 5/2020
JP 2021139017 A 9/2021
JP 2021173475 A 11/2021
JP 2022-112921 A 8/2022

* cited by examiner

*Primary Examiner* — Joseph A Miller, Jr.
(74) *Attorney, Agent, or Firm* — Armstrong Teasdale LLP

(57) ABSTRACT

A substrate processing apparatus includes: a stage having a first contact surface; a freezing device having a second contact surface; an elevating device to be capable of thermally connecting or separating the second contact surface and the first contact surface; and a heat conductive member interposed between the first contact surface and the second contact surface, wherein the heat conductive member is made of a soft metal that is softer than at least one of a material of the first contact surface or a material of the second contact surface.

10 Claims, 7 Drawing Sheets

SUBSTRATE PROCESSING APPARATUS

CROSS-REFERENCE TO RELATED APPLICATION

This application is based upon and claims the benefit of priority from Japanese Patent Application No. 2022-207216, filed on Dec. 23, 2022, the entire contents of which are incorporated herein by reference.

TECHNICAL FIELD

The present disclosure relates to a substrate processing apparatus.

BACKGROUND

In Patent Document 1, there is known a substrate processing apparatus that includes a freezing device having a freezer and a cold link, a stage having a mounting part on which a substrate is mounted, a contactor arranged on the cold link side, and a contactor arranged on the stage side, wherein a soft indium sheet with good thermal conductivity is sandwiched between the mounting part and the contactor arranged on the stage side.

Further, in Patent Document 2, there is known a holding device that includes a rotatable stage including a base and a chuck plate provided on the upper surface of the base via an indium sheet.

PRIOR ART DOCUMENTS

Patent Documents

Patent Document 1: Japanese Patent Laid-Open Publication No. 2022-112921

Patent Document 2: Japanese Patent No. 6559347

SUMMARY

According to one embodiment of the present disclosure, there is provided a substrate processing apparatus, including: a stage having a first contact surface; a freezing device having a second contact surface; an elevating device to be capable of thermally connecting or separating the second contact surface and the first contact surface; and a heat conductive member interposed between the first contact surface and the second contact surface, wherein the heat conductive member is made of a soft metal that is softer than at least one of a material of the first contact surface or a material of the second contact surface.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
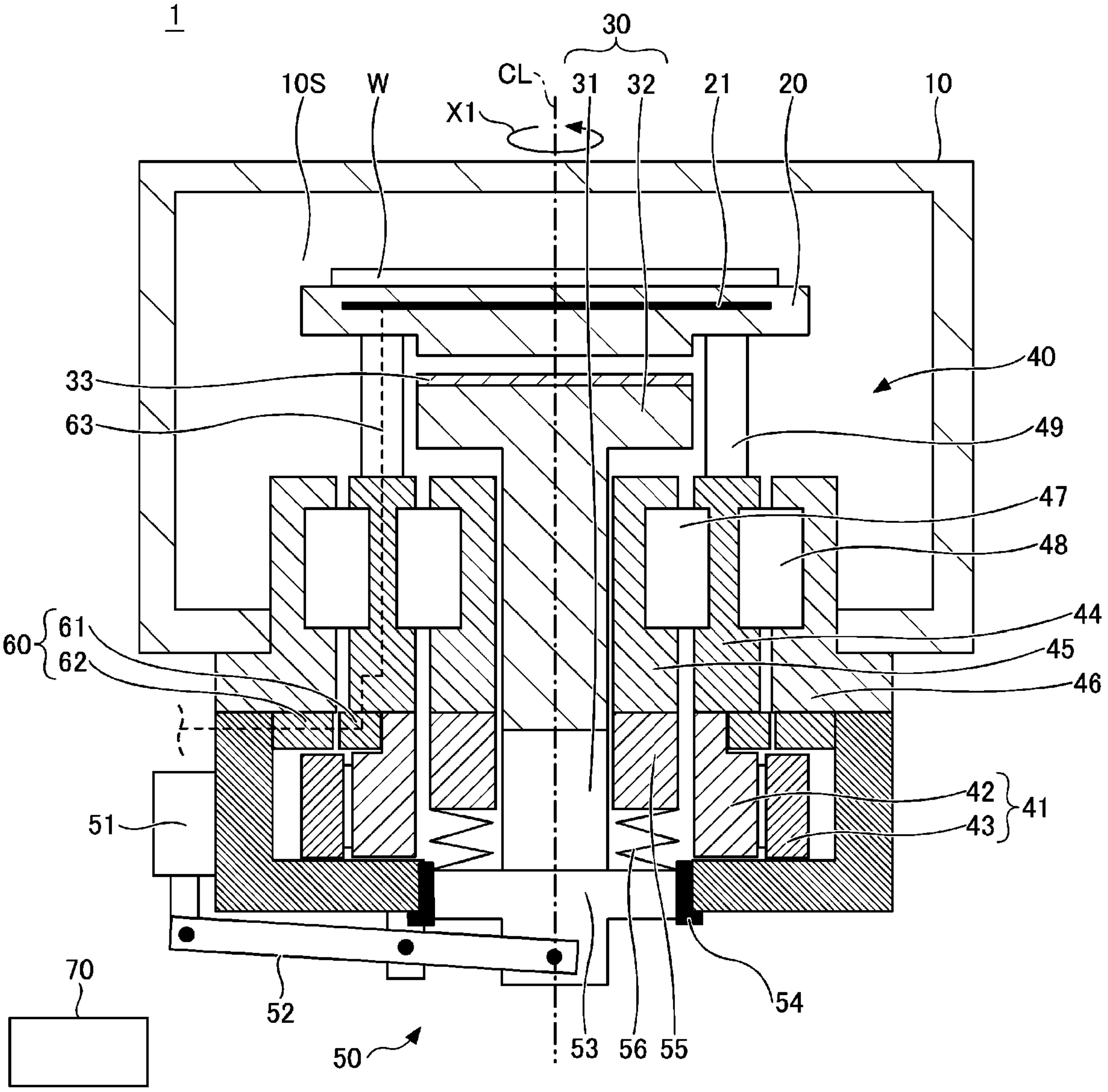
FIG. 1 is a sectional view showing an example of the configuration of a substrate processing apparatus according to a first embodiment when a stage is rotated.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for implementing the present disclosure will be described with reference to the drawings. Throughout the drawings, the same components are designated by like reference numerals, and the redundant descriptions thereof are omitted in some cases.

Substrate Processing Apparatus 1 According to the First Embodiment

Figure 2:
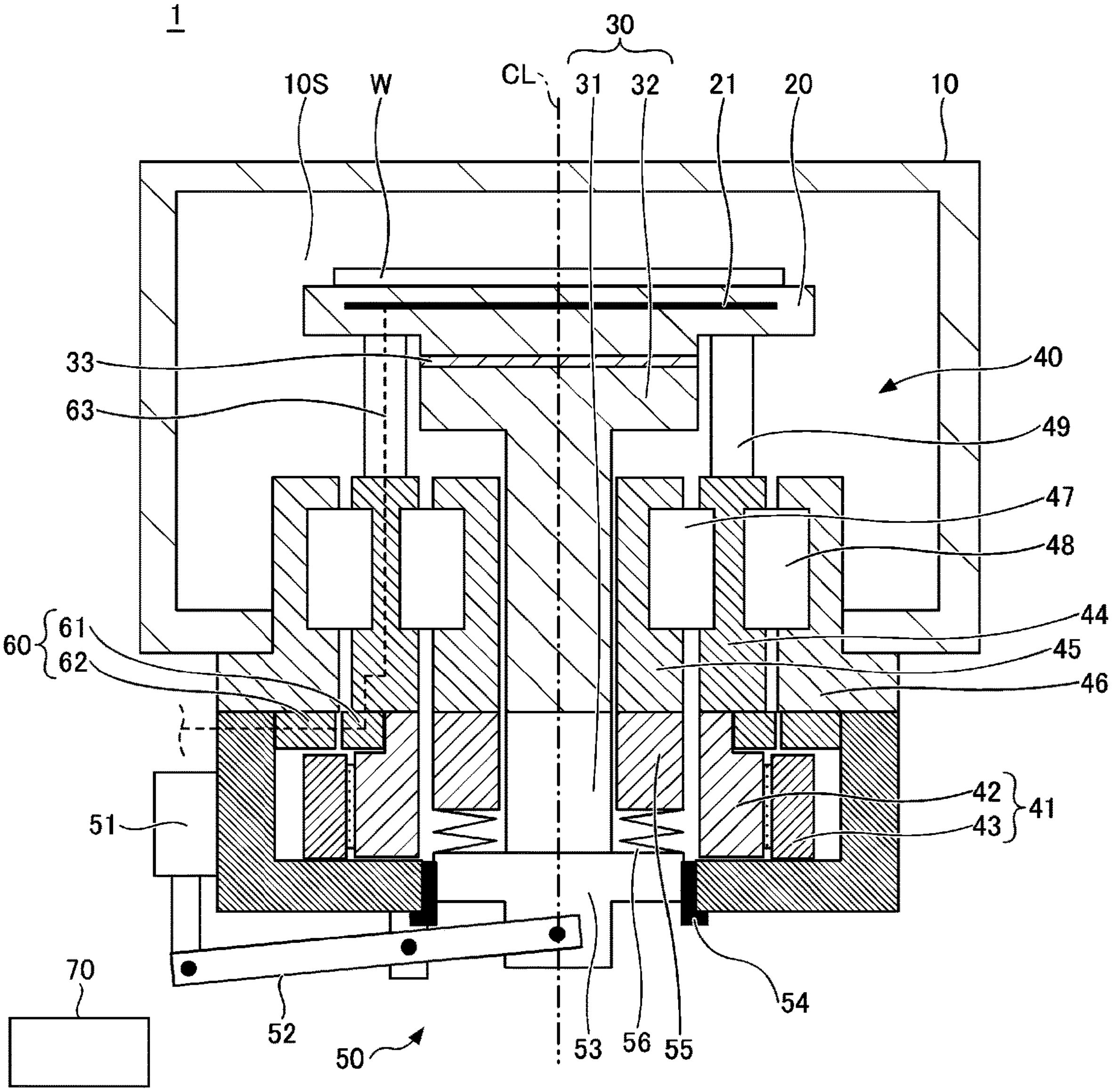
FIG. 2 is a sectional view showing an example of the configuration of the substrate processing apparatus according to the first embodiment when the stage is cooled.

An example of the substrate processing apparatus 1 according to the first embodiment will be described with reference to FIGS. 1 and 2. FIG. 1 is a sectional view showing an example of the configuration of the substrate processing apparatus according to the first embodiment when a stage 20 is rotated. FIG. 2 is a sectional view showing an example of the configuration of the substrate processing apparatus according to the first embodiment when the stage 20 is cooled.

The substrate processing apparatus 1 may be, for example, a substrate processing apparatus such as a CVD (Chemical Vapor Deposition) apparatus, an ALD (Atomic Layer Deposition) apparatus or the like that supplies a processing gas into a processing container 10 and performs a desired process (e.g., a film-forming process) on a substrate W. The substrate processing apparatus 1 may also be, for example, a substrate processing apparatus such as a PVD (Physical Vapor Deposition) apparatus or the like that performs a desired process (e.g., a film-forming process) on a substrate W by supplying a processing gas into a processing container 10 and sputtering a target provided in the processing container 10.

The substrate processing apparatus 1 includes a processing container 10, a stage 20 configured to mount a substrate W inside the processing container 10, a freezing device 30, a rotation device 40 configured to rotate the stage 20, and an elevating device 50 that raises and lowers the freezing device 30. The substrate processing apparatus 1 further includes a slip ring 60 for supplying electric power to a chuck electrode 21 of the rotating stage 20. The substrate processing apparatus 1 further includes a control device 70 configured to control various devices such as the freezing device 30, the rotation device 40, and the elevating device 50.

The processing container 10 forms an internal space 10S therein. The processing container 10 is configured such that its internal space 10S is depressurized to an ultra-high vacuum by operating an exhaust device (not shown) such as a vacuum pump or the like. Further, the processing container 10 is configured such that a desired gas used for a substrate processing process is supplied to the processing container 10 via a gas supply pipe (not shown) communicating with a processing gas supply device (not shown).

A stage 20 on which a substrate W is mounted is provided inside the processing container 10. The stage 20 is made of a material having high thermal conductivity (e.g., Cu). The stage 20 includes an electrostatic chuck. The electrostatic chuck has a chuck electrode 21 embedded within a dielectric film. A predetermined electric potential is applied to the chuck electrode 21 via a slip ring 60 and a wiring 63, which will be described later. With this configuration, the substrate W can be attracted by the electrostatic chuck and fixed on the upper surface of the stage 20. The stage 20 has a first contact surface that is thermally connected to a second contact surface of a freezing device 30, which will be described later. In the example shown in FIGS. 1 and 2, the first contact surface is formed on the lower surface of the stage 20.

A freezing device 30 is provided below the stage 20. The freezing device 30 is configured by stacking a freezer 31 and a cold link 32. The cold link 32 may also be referred to as a freezing support part. The freezer 31 supports the cold link 32 and cools the upper surface of the cold link 32 to an extremely low temperature. From the viewpoint of cooling capacity, it is preferable that the freezer 31 utilizes a GM (Gifford-McMahon) cycle. The cold link 32 is fixed on the freezer 31, and its upper portion is accommodated inside the processing container 10. The cold link 32 is made of a material having high thermal conductivity (e.g., Cu), and has a substantially cylindrical outer shape. The cold link 32 is arranged so that its center coincides with the central axis CL of the stage 20. The cold link 32 has a second contact surface that is thermally connected to the first contact surface of the stage 20. In the example shown in FIGS. 1 and 2, the second contact surface is formed on the upper surface of the cold link 32.

Further, a heat conductive member 33 is arranged on the upper surface of the cold link 32. In a state in which the thermal connection between the stage 20 and the freezing device 30 is released (see FIG. 1), the heat conductive member 33 is arranged on the upper surface of the cold link 32 of the freezing device 30. Further, in a state in which the stage 20 and the freezing device 30 are thermally connected (see FIG. 2), the heat conductive member 33 is interposed between the lower surface (first contact surface) of the stage 20 and the upper surface (second contact surface) of the cold link 32 of the freezing device 30.

The heat conductive member 33 is made of elastically deformable soft metal. In other words, the heat conductive member 33 is formed of a soft metal that is more elastically deformable than the material of the lower surface of the stage 20 and/or the upper surface of the cold link 32. The heat conductive member 33 is made of a metal whose hardness (e.g., Vickers hardness) is smaller than that of the material of the lower surface of the stage 20 and/or the upper surface of the cold link 32. Further, the heat conductive member 33 is made of a material that can be used in the vacuum atmosphere of the internal space 10S and can be used at an extremely low temperatures achieved by the freezer 31. In addition, the heat conductive member 33 is made of a material that does not affect the substrate processing process. The heat conductive member 33 is preferably made of a material having high thermal conductivity. The material of the heat conductive member 33 may be a material having lower thermal conductivity than the material of the lower surface of the stage 20 and/or the upper surface of the cold link 32. Specifically, indium, silver, tin, or the like may be used as the soft metal. Further, the heat conductive member 33 is formed as a sheet-like member (a soft metal sheet, such as an indium sheet or the like). As a result, even if the material of the heat conductive member 33 has lower thermal conductivity than the material of the lower surface of the stage 20 and/or the upper surface of the cold link 32, the influence on the overall heat conduction from the freezer 31 to the stage 20 can be sufficiently reduced by forming the heat conductive member 33 into a thin sheet-like member.

The stage 20 is rotatably supported by a rotation device 40. The rotation device 40 includes a rotational drive device 41, a fixed shaft 45, a rotary shaft 44, a housing 46, magnetic fluid seals 47 and 48, and a stand 49.

The rotational drive device 41 is a direct drive motor having a rotor 42 and a stator 43. The rotor 42 has a substantially cylindrical shape and extends coaxially with the rotary shaft 44. The rotor 42 is fixed to the rotary shaft 44. The stator 43 has a substantially cylindrical shape with an inner diameter larger than the outer diameter of the rotor 42. The rotational drive device 41 may be in a form other than the direct drive motor, or may be in a form including a servo motor and a transmission belt.

The rotary shaft 44 has a substantially cylindrical shape and extends coaxially with the central axis CL of the stage 20. The fixed shaft 45 is provided on the radially inner side of the rotary shaft 44. The fixed shaft 45 has a substantially cylindrical shape and extends coaxially with the center axis CL of the stage 20. The housing 46 is provided on the radially outer side of the rotary shaft 44. The housing 46 has a substantially cylindrical shape and extends coaxially with the center axis CL of the stage 20. The housing 46 is fixed to the processing container 10.

Further, the magnetic fluid seal 47 is provided between the outer circumferential surface of the fixed shaft 45 and the inner circumferential circle of the rotary shaft 44. The magnetic fluid seal 47 rotatably supports the rotary shaft 44 with respect to the fixed shaft 45, and also seals a gap between the outer circumferential surface of the fixed shaft 45 and the inner circumferential surface of the rotary shaft 44, thereby separating the pressure-reducible internal space 10S of the processing container 10 and the external space of the processing container 10. Further, the magnetic fluid seal 48 is provided between the inner circumferential surface of the housing 46 and the outer circumferential surface of the rotary shaft 44. The magnetic fluid seal 48 rotatably supports the rotary shaft 44 with respect to the housing 46, and seals a gap between the inner circumferential surface of the housing 46 and the outer circumferential surface of the rotary shaft 44, thereby separating the pressure-reducible internal space 10S of the processing container 10 and the external space of the processing container 10. Thus, the rotary shaft 44 is rotatably supported by the fixed shaft 45 and the housing 46.

Further, the cold link 32 is inserted into the radially inner side of the fixed shaft 45.

The stand 49 is provided between the rotary shaft 44 and the stage 20 and is configured to transmit the rotation of the rotary shaft 44 to the stage 20.

With the above configuration, when the rotor 42 of the rotational drive device 41 rotates, the rotary shaft 44, the stand 49, and the stage 20 are rotated in the X1 direction relative to the cold link 32.

The freezing device 30 is supported by the elevating device 50 so that it can be raised and lowered freely. The elevating device 50 includes an air cylinder 51, a link mechanism 52, a freezing device support part 53, a linear guide 54, a fixed part 55, and a bellows 56. The elevating device 50 can raise and lower the freezing device 30 to thereby switch a state (see FIG. 2) in which the lower surface (first contact surface) of the stage 20 and the upper surface (second contact surface) of the cold link 32 are thermally connected and a state (see FIG. 1) in which the lower surface (first contact surface) of the stage 20 and the upper surface (second contact surface) of the cold link 32 are separated.

The air cylinder 51 is a mechanical device in which a rod is moved linearly by an air pressure. The link mechanism 52 converts the linear movement of the rod of the air cylinder 51 into the vertical movement of the freezing device support part 53. Further, the link mechanism 52 has a lever structure in which one end of the link mechanism 52 is connected to the air cylinder 51 and the other end of the link mechanism 52 is connected to the freezing device support part 53. As a result, a large pressing force can be generated by a small thrust of the air cylinder 51. The freezing device support part 53 supports the freezing device 30 (the freezer 31 and the cold link 32). Furthermore, the movement direction of the freezing device support part 53 is guided into a raising/lowering direction by the linear guide 54.

The fixed part 55 is fixed to the lower surface of the fixed shaft 45. A substantially cylindrical bellows 56 that surrounds the freezer 31 is provided between the lower surface of the fixed part 55 and the upper surface of the freezing device support part 53. The bellows 56 is a metal bellows structure that can be expanded and contracted in the vertical direction. Thus, the fixed part 55, the bellows 56, and the freezing device support part 53 seal a gap between the inner circumferential surface of the fixed shaft 45 and the outer circumferential surface of the cold link 32, thereby separating the pressure-reducible internal space 10S of the processing container 10 and the external space of the processing container 10. Further, the lower surface side of the freezing device support part 53 is adjacent to the external space of the processing container 10, and the region surrounded by the bellows 56 on the upper surface side of the freezing device support part 53 is adjacent to the internal space 10S of the processing container 10.

The slip ring 60 is provided below the rotary shaft 44 and the housing 46. The slip ring 60 has a rotary body 61 including a metal ring and a fixed body 62 including a brush. The rotary body 61 has a substantially cylindrical shape and extends coaxially with the rotary shaft 44. The rotary body 61 is fixed to the lower surface of the rotary shaft 44. The fixed body 62 has a substantially cylindrical shape whose inner diameter is slightly larger than the outer diameter of the rotary body 61, and is fixed to the lower surface of the housing 46. The slip ring 60 is electrically connected to a DC power source (not shown) to supply electric power from the DC power source to the wiring 63 via the brush of the fixed body 62 and the metal ring of the rotary body 61. With this configuration, an electric potential can be applied to the chuck electrode 21 from the DC power source without causing twisting or the like in the wiring 63. The structure of the slip ring 60 may be a structure other than a brush structure, and may be, for example, a non-contact power supply structure, a mercury-free structure, a structure including conductive liquid, or the like.

The control device 70 is, for example, a computer, and includes a CPU (Central Processing Unit), a RAM (Random Access Memory), a ROM (Read Only Memory), an auxiliary memory device, and the like. The CPU operates based on a program stored in the ROM or the auxiliary memory device which are computer readable storage devices, and controls the operation of the substrate processing apparatus 1. The control device 70 may be provided inside the substrate processing apparatus 1 or may be provided outside the substrate processing apparatus 1. When the control device 70 is provided outside the substrate processing apparatus 1, the control device 70 can control the substrate processing apparatus 1 using a wired or wireless communication means.

When performing a desired process on the substrate W, as shown in FIG. 1, the control device 70 controls the elevating device 50 (air cylinder 51) to separate the stage 20 and the cold link 32, and controls the rotation device 40 (rotational drive device 41) to rotate the stage 20 on which the substrate W is mounted. As a result, it is possible to improve the in-plane uniformity of a substrate processing process (e.g., a film-forming process, or the like) for the substrate W.

Further, when cooling the stage 20 and the substrate W mounted on the stage 20, as shown in FIG. 2, the control device 70 stops the rotation device 40 (rotational drive device 41) to stop the rotation of the stage 20, and also controls the elevating device 50 (air cylinder 51) to bring the stage 20 and the cold link 32 into contact with each other. As a result, the cold link 32 and the stage 20 can be thermally connected via the heat conductive member 33 to cool the substrate W mounted on the stage 20.

If the pressing force for pressing the cold link 32 against the stage 20 is insufficient, a loss occurs in heat conduction, and the cooling capacity to the stage 20 is insufficient.

On the other hand, in the substrate processing apparatus 1, the upper surface (second contact surface) of the cold link 32 contacts the lower surface (first contact surface) of the stage 20 via the heat conductive member 33. Thus, the cold link 32 is kept against movement.

In addition, by reducing the pressure in the internal space 10S of the processing container 10 to create a vacuum atmosphere, a differential pressure difference (vacuum differential pressure) is generated between the upper surface of the freezing device support part 53, which is in a vacuum atmosphere, and the lower surface of the freezing device support part 53, which is in an air atmosphere, thereby generating a pressing force that presses the cold link 32 toward the stage 20. Therefore, a pressing force is applied to the cold link 32 by the thrust of the air cylinder 51 and the differential pressure difference (vacuum differential pressure) generated between the upper surface and the lower surface of the freezing device support part 53. As a result, when the cold link 32 is brought into contact with the stage 20 to cool the stage 20, even if the stage 20 is thermally shrunken, the pressing force enables the cold link 32 to rise in response to the thermal shrinkage of the stage 20.

Further, the cold link 32 is guided up and down by the freezing device support part 53 and the linear guide 54. As a result, the cold link 32 can be raised and lowered while the lower surface (first contact surface) of the stage 20 and the upper surface (second contact surface) of the cold link 32 are kept parallel.

A shim (not shown) may be inserted into the cold link 32 to adjust the parallelism of the upper surface (second contact surface) of the cold link 32 with respect to the lower surface (first contact surface) of the stage 20.

Further, by using the air cylinder 51 driven by an air, the pressing force can be easily adjusted by the air pressure.

Figure 3A:
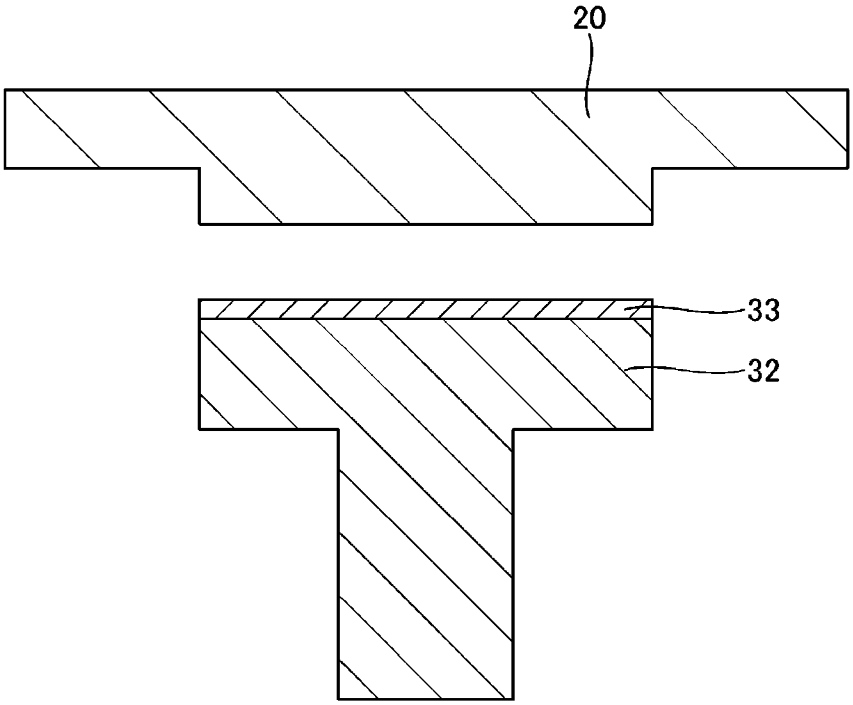
FIGS. 3A and 3B are diagrams showing an example of a contact portion between the stage and the cold link in the substrate processing apparatus according to the first embodiment.
Figure 3B:
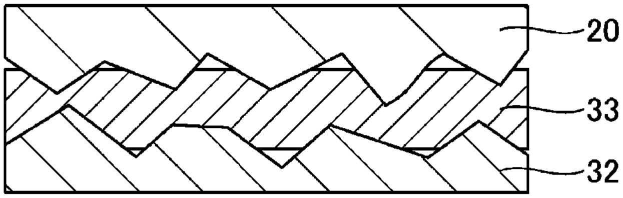
Figure 4A:
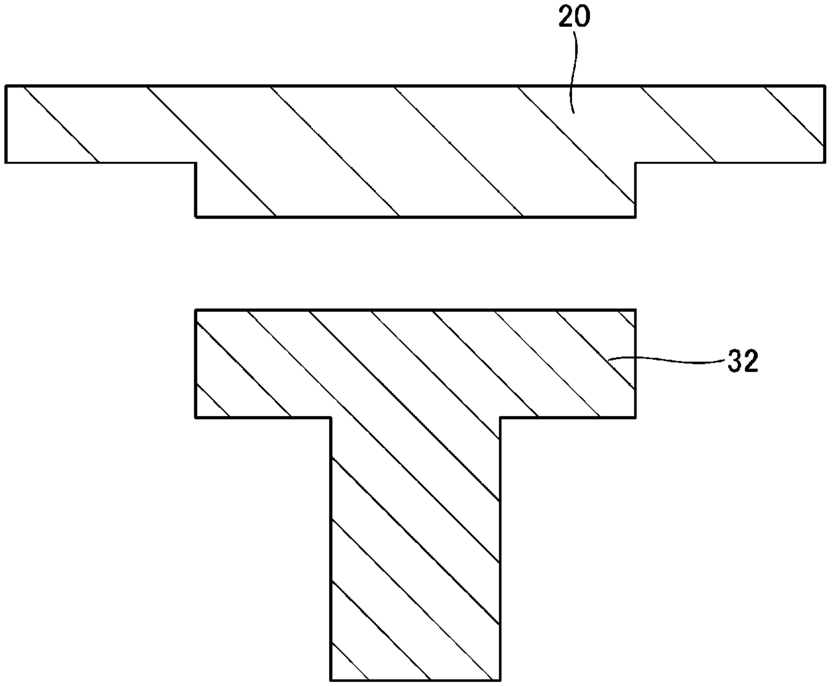
FIGS. 4A and 4B are diagrams showing an example of a contact portion between a stage and a cold link in a substrate processing apparatus according to a reference example.
Figure 4B:
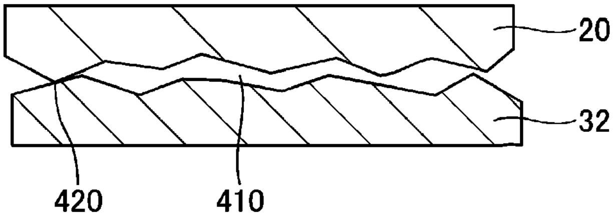

The contact portion (thermal connection portion) between the stage 20 and the cold link 32 will be further described with reference to FIGS. 3A, 3B, 4A and 4B. FIGS. 3A and 3B are diagrams showing an example of the contact portion between the stage 20 and the cold link 32 in the substrate processing apparatus 1 according to the first embodiment. FIG. 3A is a sectional view showing an example of the contact portion between the stage 20 and the cold link 32 in the substrate processing apparatus 1 according to the first embodiment. FIG. 3B is an enlarged sectional view showing an example of the contact portion between the stage 20 and the cold link 32 in the substrate processing apparatus 1 according to the first embodiment. FIGS. 4A and 4B are diagrams showing an example of the contact portion between the stage 20 and the cold link 32 in a substrate processing apparatus according to a reference example. FIG. 4A is a sectional view showing an example of the contact portion between the stage 20 and the cold link 32 in the substrate processing apparatus according to the reference example. FIG. 4B is an enlarged sectional view showing an example of the contact portion between the stage 20 and the cold link 32 in the substrate processing apparatus according to the reference example.

As shown in FIG. 4A, the substrate processing apparatus according to the reference example differs from the substrate processing apparatus 1 according to the first embodiment (see FIGS. 1 to 3B) in that it includes a heat conductive member 33. Other configurations are the same, and the redundant descriptions thereof will be omitted.

The stage 20 and the cold link 32 are made of a material having high thermal conductivity (e.g., Cu). Further, the lower surface of the stage 20 and the upper surface of the cold link 32 have surface roughness that depends on the processing accuracy. Therefore, when the freezing device 30 is raised by the elevating device 50 and the upper surface of the cold link 32 is brought into contact with the lower surface of the stage 20, as shown in FIG. 4B, a cavity 410 is formed between the lower surface of the stage 20 and the upper surface of the cold link 32. The upper surface of the cold link 32 and the lower surface of the stage 20 come into contact with each other only at some contact portions 420. Further, the cold link 32 and the stage 20 are arranged in the internal space 10S kept in a vacuum atmosphere, and the cavity 410 is also kept in a vacuum atmosphere. Therefore, the size of the contact area at the contact portion 420 between the lower surface of the stage 20 and the upper surface of the cold link 32 affects heat transfer. In other words, the thermal resistance due to the cavity 410 is large, and the thermal resistance at the contact portion between the stage 20 and the cold link 32 is large.

On the other hand, in the substrate processing apparatus 1 according to the first embodiment, as shown in FIG. 3A, the heat conductive member 33 is arranged on the upper surface of the cold link 32. When the freezing device 30 is raised by the elevating device 50 and the upper surface of the cold link 32 is brought into contact with the lower surface of the stage 20 (see FIG. 2), as shown in FIG. 3B, the heat conductive member 33 is elastically deformed in conformity with the surface roughness of the upper surface of the cold link 32 and the lower surface of the stage 20. Thus, the contact area between the upper surface of the heat conductive member 33 and the lower surface of the stage 20 is larger than the contact area at the contact portion 420 (see FIG. 4B). Further, the contact area between the lower surface of the heat conductive member 33 and the upper surface of the cold link 32 is larger than the contact area at the contact portion 420 (see FIG. 4B). Thus, it is possible to reduce the thermal resistance at the contact portion between the stage 20 and the cold link 32. Accordingly, the cooling performance for the stage 20 by the freezer 31 is improved.

Although the heat conductive member 33 has been described as being arranged on the upper surface side of the cold link 32, the present disclosure is not limited thereto, and may be arranged on the lower surface side of the stage 20. The heat conductive member 33 is preferably arranged on the upper surface side of the cold link 32.

Further, when the heat conductive member 33 is a sheet-like member (soft metal sheet), the thickness of the heat conductive member 33 is preferably 3 mm or less. Moreover, the thickness of the heat conductive member 33 is more preferably within the range of 0.3 mm or more and 1.5 mm or less. Thus, it is possible to suppress an increase in thermal resistance due to the interposition of the heat conductive member 33 while absorbing the surface roughness on the lower surface of the heat conductive member 33 and the surface roughness on the upper surface of the cold link 32.

Although the heat conductive member 33 has been described as being formed as a sheet-like member (a soft metal sheet, e.g., an indium sheet) and being arranged on the upper surface of the cold link 32, the present disclosure is not limited thereto. The heat conductive member 33 may be a soft metal film (e.g., an indium film, indium plating, or the like) formed on the upper surface of the cold link 32. The metal film may be formed by a film-forming process or may be formed by a plating process. By using the metal film as the heat conductive member 33, it is possible to further improve the adhesion between the heat conductive member 33 and the cold link 32.

The heat conductive member 33 may be configured to use a liquid such as grease or the like that can be used in a vacuum atmosphere and at an extremely low temperature.

Second Embodiment

Figure 5:
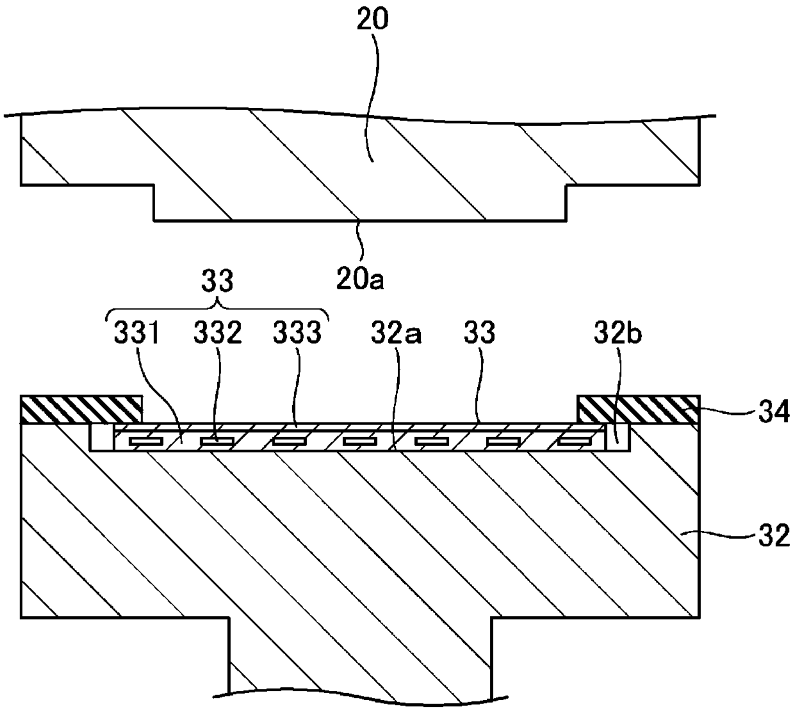
FIG. 5 is a diagram showing an example of a contact portion between a stage and a cold link in a substrate processing apparatus according to a second embodiment.

Next, an example of a substrate processing apparatus 1 according to a second embodiment will be described with reference to FIG. 5. FIG. 5 is a diagram showing an example of a contact portion between the stage 20 and the cold link 32 in the substrate processing apparatus 1 according to the second embodiment. As shown in FIG. 5, the substrate processing apparatus 1 according to the second embodiment differs from the substrate processing apparatus 1 according to the first embodiment (see FIGS. 1 to 3B) in terms of the configuration of the contact portion between the stage 20 and the cold link 32. Other configurations are the same, and the duplicate descriptions thereof will be omitted.

The elevating device 50 presses the cold link 32 toward the stage 20 (see FIG. 2). Thus, the heat conductive member 33 is elastically deformed in conformity with the surface roughness of the lower surface of the stage 20. When the contact area between the lower surface of the stage 20 and the upper surface of the heat conductive member 33 increases, the adhesion between the stage 20 and the heat conductive member 33 also increases. Therefore, the heat conductive member 33 may stick to the lower surface side of the stage 20. By separating the cold link 32 from the stage 20 in a state in which the heat conductive member 33 is stuck to the lower surface of the stage 20 (see FIG. 1), the heat conductive member 33 may be deformed by being lifted up from the upper surface of the cold link 32. Further, in the state in which the heat conductive member 33 is stuck to the lower surface side of the stage 20, the heat conductive member 33 may be deformed or damaged as the stage 20 is rotated in the X1 direction by the rotation device 40.

The substrate processing apparatus 1 according to the second embodiment has a recess 32*a* formed on the upper surface of the cold link 32 to accommodate the heat conductive member 33. Further, the width of the recess 32*a* in the horizontal direction is larger than the width of the heat conductive member 33 in the horizontal direction. That is, an outer peripheral space 32*b* is formed between the side wall of the recess 32*a* and the side surface of the heat conductive member 33 arranged in the recess 32*a*. Thus, when the freezing device 30 is pressed against the stage 20 by the elevating device 50, the heat conductive member 33 is compressed in the vertical direction, and can be pushed and expanded in the horizontal direction toward the outer peripheral space 32*b*.

Further, the substrate processing apparatus 1 according to the second embodiment includes a pressing member 34 that presses the outer peripheral portion of the heat conductive member 33 accommodated in the recess 32*a* toward the cold link 32. The pressing member 34 is formed in an annular shape with an open center when viewed from above. The pressing member 34 is in contact with the outer edge of the upper surface of the heat conductive member 33 and is fixed to the cold link 32. As a result, when the cold link 32 is separated from the stage 20, even if the heat conductive member 33 is stuck to the lower surface side of the stage 20, it is possible to prevent the heat conductive member 33 from being lifted up from the upper surface of the cold link 32 and being deformed, by pressing the heat conductive member 33 with the pressing member 34, In addition, the heat conductive member 33 includes a soft metal sheet 331 and a protection portion 333.

The soft metal sheet 331 is a sheet-like member made of elastically deformable soft metal. The soft metal sheet 331 is made of a soft metal that is more elastically deformable than the material of the lower surface of the stage 20 and/or the upper surface of the cold link 32. In other words, the heat conductive member 33 is made of a metal whose hardness (e.g., Vickers hardness) is smaller than that of the material of the lower surface of the stage 20 and/or the upper surface of the cold link 32. Further, the soft metal sheet 331 is made of a material that can be used in the vacuum atmosphere of the internal space 10S and can be used at an extremely low temperature achieved by the freezer 31. Further, the soft metal sheet 331 is made of a material that does not affect a substrate processing process. Further, the soft metal sheet 331 is preferably made of a material having high thermal conductivity. The material of the soft metal sheet 331 may be a material having a lower thermal conductivity than the material of the lower surface of the stage 20 and/or the upper surface of the cold link 32. Specifically, indium, silver, tin, or the like may be used. In addition, the soft metal sheet 331 is formed as a sheet-like member (e.g., an indium sheet, or the like).

The protection portion 333 is provided on the upper surface side of the soft metal sheet 331 (in other words, on the lower surface (first contact surface) side of the stage 20). The protection portion 333 protects the upper surface of the soft metal sheet 331 and improves the durability of the upper surface of the heat conductive member 33, which is repeatedly contacted and separated. The protection portion 333 may be a sheet-like member, or may be a film (plating) formed on the upper surface of the soft metal sheet 331. The protection portion 333 is made of a metal (a hardly deformable material) that is harder than the material of the soft metal sheet 331 (indium, silver, tin, or the like). In other words, the protection portion 333 is formed of a material having a higher hardness (e.g., Vickers hardness) than the material of the soft metal sheet 331. For example, a Cu sheet with a thickness of 0.1 mm may be used for the protection portion 333. Further, the protection portion 333 may be a Cu film (plating) formed on the upper surface of the soft metal sheet 331. Therefore, when the cold link 32 is separated from the stage 20, it is possible to prevent the heat conductive member 33 from sticking to the lower surface side of the stage 20. The thickness of the protection portion 333 is set to be sufficiently thinner than the thickness of the soft metal sheet 331. As a result, the protection portion 333 can be deformed together with the soft metal sheet 331 to follow the surface roughness of the lower surface of the stage 20. That is, the heat conductive member 33 having the soft metal sheet 331 and the protection portion 333 can reduce the thermal resistance at the contact portion between the stage 20 and the cold link 32 as compared with the reference example (see FIGS. 4A and 4B), and can also prevent the heat conductive member 33 from sticking to the lower surface side of the stage 20.

Further, the heat conductive member 33 has an internal structure 332 within the soft metal sheet 331. The internal structure 332 is made of a metal (hardly elastically deformable metal) that is harder than the material of the soft metal sheet 331 (indium, silver, tin, or the like). In other words, the internal structure 332 is formed of a material having a higher hardness (e.g., Vickers hardness) than the material of the soft metal sheet 331. For example, a Cu mesh may be used for the internal structure 332. The internal structure 332 may be a Cu sheet. As a result, when the freezing device 30 is raised by the elevating device 50 and the upper surface of the cold link 32 is brought into contact with the lower surface of the stage 20 (see FIG. 2), the soft metal sheet 331 and the protection portion 333 of the heat conductive member 33 are is elastically deformed in conformity with the surface roughness of the lower surface of the stage 20. This increases the contact area between the upper surface of the heat conductive member 33 and the lower surface of the stage 20. Further, when the freezing device 30 is lowered by the elevating device 50 and the cold link 32 and the stage 20 are separated from each other (see FIG. 1), the internal structure 332 can suppress the deformation of the heat conductive member 33 and can prevent the heat conductive member 33 from sticking to the lower surface side of the stage 20. Furthermore, it is possible to suppress the crushing of the soft metal sheet 331 beyond the amount of deformation required to follow the surface roughness of the lower surface of the stage 20 and/or the upper surface of the cold link 32, which makes it possible to improve the durability of the heat conductive member 33.

By using a material having higher thermal conductivity than the material of the soft metal sheet 331 as the material of the internal structure 332, it is possible to reduce the thermal resistance of the heat conductive member 33.

Although the heat conductive member 33 has been described as having both the internal structure 332 and the protection portion 333, the present disclosure is not limited thereto, and may have a configuration having only one of them. The heat conductive member 33 may omit the protection portion 333. As a result, the contact interface between the soft metal sheet 331 and the protection portion 333 can be reduced to thereby reduce the thermal resistance.

Next, the effects of the heat conductive member 33 will be described with reference to FIGS. 6 and 7.

Figure 6:
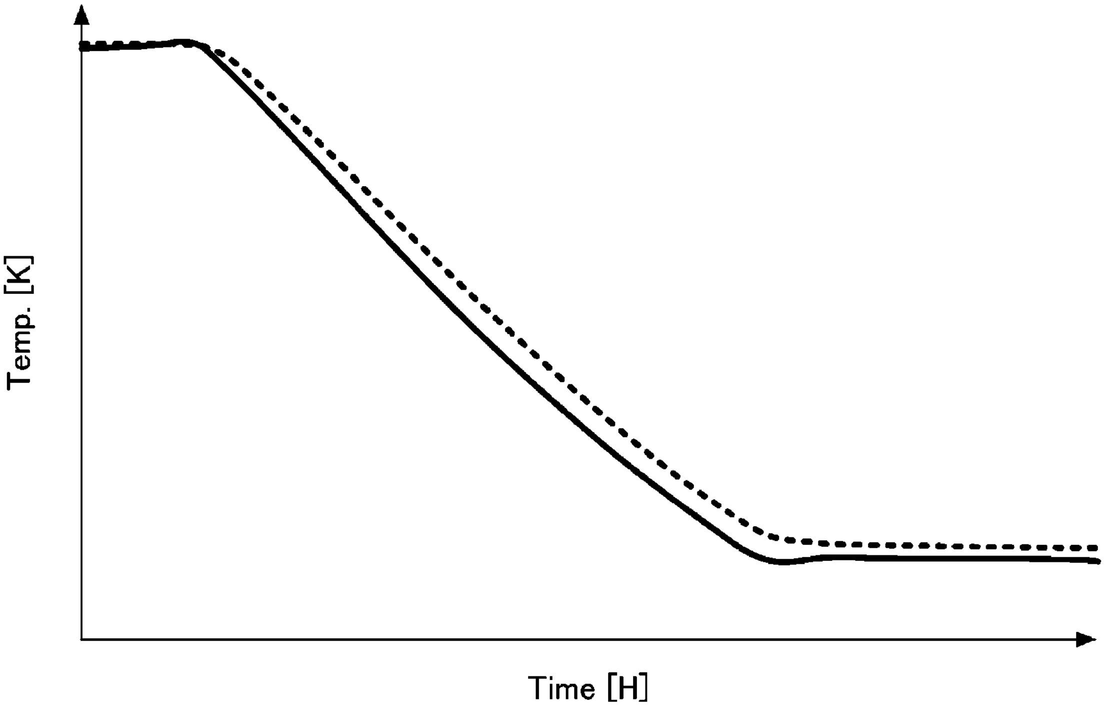
FIG. 6 is a graph showing an example of temperature changes when the stage is cooled.

FIG. 6 is a graph showing an example of changes in the temperature of the stage 20 when cooling the stage 20. The horizontal axis indicates the time (Time [H]). The vertical axis indicates the temperature (Temp. [K]) of the stage 20. The stage 20 is cooled from the room temperature to an extremely low temperature by the freezer 31. The solid line indicates the changes in the temperature of the stage 20 in the substrate processing apparatus 1 according to the present embodiment (the first embodiment and the second embodiment) in which the heat conductive member 33 is interposed between the stage 20 and the cold link 32. The broken line indicates the changes in the temperature of the stage 20 in the substrate processing apparatus according to the reference example (see FIGS. 4A and 4B) in which the heat conductive member 33 is not interposed between the stage 20 and the cold link 32.

As shown in FIG. 6, in the substrate processing apparatus 1 according to the present embodiment, the stage 20 can be cooled to a lower temperature than that in the substrate processing apparatus according to the reference example. Moreover, in the substrate processing apparatus 1 according to the present embodiment, the time required for the temperature of the stage 20 to stabilize (the time required for the cooling to be completed) can be made shorter than that in the substrate processing apparatus according to the reference example.

Figure 7:
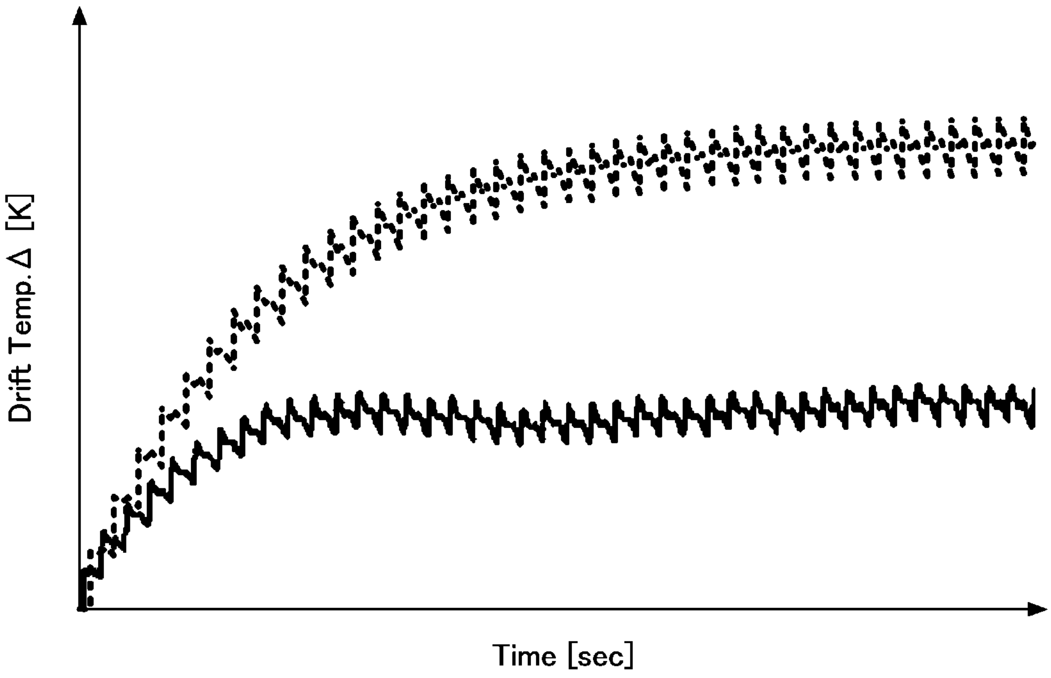
FIG. 7 is a graph showing an example of changes in the temperature of the stage.

FIG. 7 is a graph showing an example of changes in the temperature of the stage 20. A process of cooling the stage 20 in a state in which the stage 20 and the freezing device 30 are in contact with each other (see FIG. 2) and a process of mounting the substrate W on the stage 20 in a state in which the stage 20 and the freezing device 30 are separated from each other and rotating the stage 20 (see FIG. 1) are repeated. The horizontal axis indicates the time (Time [sec]). The vertical axis indicates the changes in the temperature change (Drift Temp. Δ [K]) of the stage 20. The solid line indicates the changes in the temperature of the stage 20 in the substrate processing apparatus 1 of the present embodiment (the first embodiment and the second embodiment) in which the heat conductive member 33 is interposed between the stage 20 and the cold link 32. The broken line indicates the changes in the temperature of the stage 20 in the substrate processing apparatus according to the reference example (see FIGS. 4A and 4B) in which the heat conductive member 33 is not interposed between the stage 20 and the cold link 32.

In the process of cooling the stage 20 in the state in which the stage 20 and the freezing device 30 are in contact with each other (see FIG. 2), the temperature of the stage 20 decreases. On the other hand, in the process of mounting the substrate W on the stage 20 in the state in which the stage 20 and the freezing device 30 are separated from each other and rotating the stage 20 (see FIG. 1), the temperature of the stage 20 increases due to radiant heat from the processing container 10, and the like. By repeating this process, the temperature of the stage 20 gradually rises. By further repeating this process, the temperature of the stage 20 becomes stable.

As shown in FIG. 7, in the substrate processing apparatus 1 according to the present embodiment, the temperature rise until the temperature of the stage 20 becomes stable can be reduced as compared with the substrate processing apparatus according to the reference example. Moreover, in the substrate processing apparatus 1 according to the present embodiment, the time required for the temperature of the stage 20 to stabilize can be shortened as compared with the substrate processing apparatus according to the reference example.

Although the substrate processing apparatus 1 has been described above, the present disclosure is not limited to the above embodiments, and various modifications and improvements may be made within the scope of the gist of the present disclosure recited in the claims.

According to the present disclosure in some embodiments, it is possible to provide a substrate processing apparatus capable of reducing thermal resistance between a stage and a freezing device.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
- a stage having a first contact surface;
- a freezing device having a second contact surface;
- an elevating device capable of thermally connecting or separating the second contact surface and the first contact surface; and
- a heat conductive member interposed between the first contact surface and the second contact surface,
- wherein the heat conductive member is formed of a soft metal sheet that is softer than at least one of a material of the first contact surface or a material of the second contact surface,
- wherein the freezing device has a recess configured to accommodate the heat conductive member, and
- wherein a space is provided between a side wall of the recess and a side surface of the heat conductive member arranged in the recess.

2. The substrate processing apparatus of claim 1, further comprising:
- a pressing member configured to press an outer edge of the heat conductive member toward the freezing device.

3. The substrate processing apparatus of claim 1, wherein the heat conductive member includes a protection portion on the soft metal sheet in a side of the first contact surface.

4. The substrate processing apparatus of claim 3, wherein the protection portion is made of a metal harder than a material of the soft metal sheet.

5. The substrate processing apparatus of claim 3, wherein the protection portion is a copper sheet.

6. The substrate processing apparatus of claim 1, wherein the heat conductive member has an internal structure configured to suppress a deformation of the heat conductive member, within the soft metal sheet.

7. The substrate processing apparatus of claim 6, wherein the internal structure is made of a harder metal than a material of the soft metal sheet.

8. The substrate processing apparatus of claim 6, wherein the internal structure is a copper mesh.

9. The substrate processing apparatus of claim 1, wherein the soft metal sheet is made of one of indium, silver, and tin.

10. The substrate processing apparatus of claim 1, wherein a thickness of the soft metal sheet is within a range of 0.3 mm or more and 1.5 mm or less.

* * * * *